US012563751B2

(12) United States Patent
Youn et al.

(10) Patent No.: US 12,563,751 B2
(45) Date of Patent: Feb. 24, 2026

(54) HETEROGENEOUS INTEGRATION FOR MEMRISTOR-BASED HARDWARE ACCELERATORS

(71) Applicant: HEWLETT PACKARD ENTERPRISE DEVELOPMENT LP, Spring, TX (US)

(72) Inventors: Jinsung Youn, Milpitas, CA (US); Xia Sheng, Milpitas, CA (US); James Ignowski, Ft. Collins, CO (US); Darrin Miller, Ft. Collins, CO (US); Catherine Graves, Milpitas, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 521 days.

(21) Appl. No.: 18/184,222

(22) Filed: Mar. 15, 2023

(65) Prior Publication Data

US 2024/0315053 A1 Sep. 19, 2024

(51) Int. Cl.
| | |
|---|---|
| *H10B 80/00* | (2023.01) |
| *H01L 23/00* | (2006.01) |
| *H01L 23/48* | (2006.01) |

(52) U.S. Cl.
CPC ............. *H10B 80/00* (2023.02); *H01L 24/16* (2013.01); *H01L 24/17* (2013.01); *H01L 23/481* (2013.01);
(Continued)

(58) Field of Classification Search
CPC ........ H10B 80/00; H10B 99/00; H10B 63/00; H01L 2924/1433; H01L 2924/1443;
(Continued)

(56) References Cited

U.S. PATENT DOCUMENTS

| | | |
|---|---|---|
| 8,928,132 B2 | 1/2015 | Choi et al. |
| 9,767,408 B1 * | 9/2017 | Boybat Kara ..... G11C 13/0002 |

(Continued)

FOREIGN PATENT DOCUMENTS

| | | | | |
|---|---|---|---|---|
| CN | 114925818 A | * | 8/2022 | ............. G06N 3/045 |
| WO | 2019/191907 A1 | | 10/2019 | |
| WO | WO-2022109593 A1 | * | 5/2022 | ............. G06N 3/065 |

OTHER PUBLICATIONS

Graves et al., "In-Memory Computing with Memristor Content Addressable Memories for Pattern Matching", 2020, 28 pages.
(Continued)

*Primary Examiner* — Lawrence C Tynes, Jr.
(74) *Attorney, Agent, or Firm* — Dickinson Wright

(57) ABSTRACT

Examples of the present technology provide heterogeneous (i.e., multi-chip) ASIC-memristor integrations that enable high voltage-dependent precision memristor programming while preserving optimal ASIC performance/capabilities. Examples achieve these advantages by "de-coupling" memristor hardware from ASIC chip. Accordingly, a heterogeneous ASIC-memristor integration of the present technology may comprise an ASIC chip packaged onto a functional "memristor-interposer" chip. The memristor interposer may serve both a functional and structural purpose. Namely, memristors of the memristor interposer can be leveraged in conjunction with the ASIC for processing/computation functions—while connections within the memristor interposer route signals between ASIC and computing system (e.g., between the ASIC and a printed circuit board).

20 Claims, 5 Drawing Sheets

(52) U.S. Cl.
CPC ............... *H01L 2224/16145* (2013.01); *H01L 2224/16225* (2013.01); *H01L 2224/17181* (2013.01); *H01L 2924/1433* (2013.01); *H01L 2924/1443* (2013.01)

(58) Field of Classification Search
CPC ......... G06F 12/0238; G06F 2212/2024; G06F 15/7839; G01K 7/183; G01L 9/06; G11C 2207/104; G11C 2216/08; H01H 2209/036; H04L 1/002; H04L 2025/03464; G03F 7/706841; G06N 20/00; G05D 2101/15; G06Q 40/03055; G06Q 40/03251; G06Q 40/0421; G06Q 40/09; G06T 5/60; H04Q 2213/133343

See application file for complete search history.

(56) References Cited

U.S. PATENT DOCUMENTS

| | | | |
|---|---|---|---|
| 10,845,535 B2 | 11/2020 | Sharma et al. | |
| 2008/0001062 A1 | 1/2008 | Gunn et al. | |
| 2008/0288908 A1 | 11/2008 | Hart et al. | |
| 2012/0091420 A1* | 4/2012 | Kusai | H10N 70/826 257/4 |
| 2013/0023106 A1* | 1/2013 | Pickett | H10D 88/00 710/305 |
| 2019/0227017 A1* | 7/2019 | Jabir | G01N 27/041 |
| 2019/0394242 A1* | 12/2019 | Wig | G06N 5/048 |
| 2020/0395540 A1* | 12/2020 | Lee | H10N 70/8828 |
| 2021/0319293 A1* | 10/2021 | Lee | G06N 3/049 |
| 2021/0406656 A1* | 12/2021 | Kumar | G11C 13/0026 |
| 2022/0181548 A1* | 6/2022 | Snyder | H10N 70/24 |

OTHER PUBLICATIONS

Hu et al., "Memristor-Based Analog Computation and Neural Network Classification with a Dot Product Engine", 2018, 30 pages.
Pedretti et al., "Tree-based machine learning performed in-memory with memristive analog CAM", Mar. 2021, 22 pages.

* cited by examiner

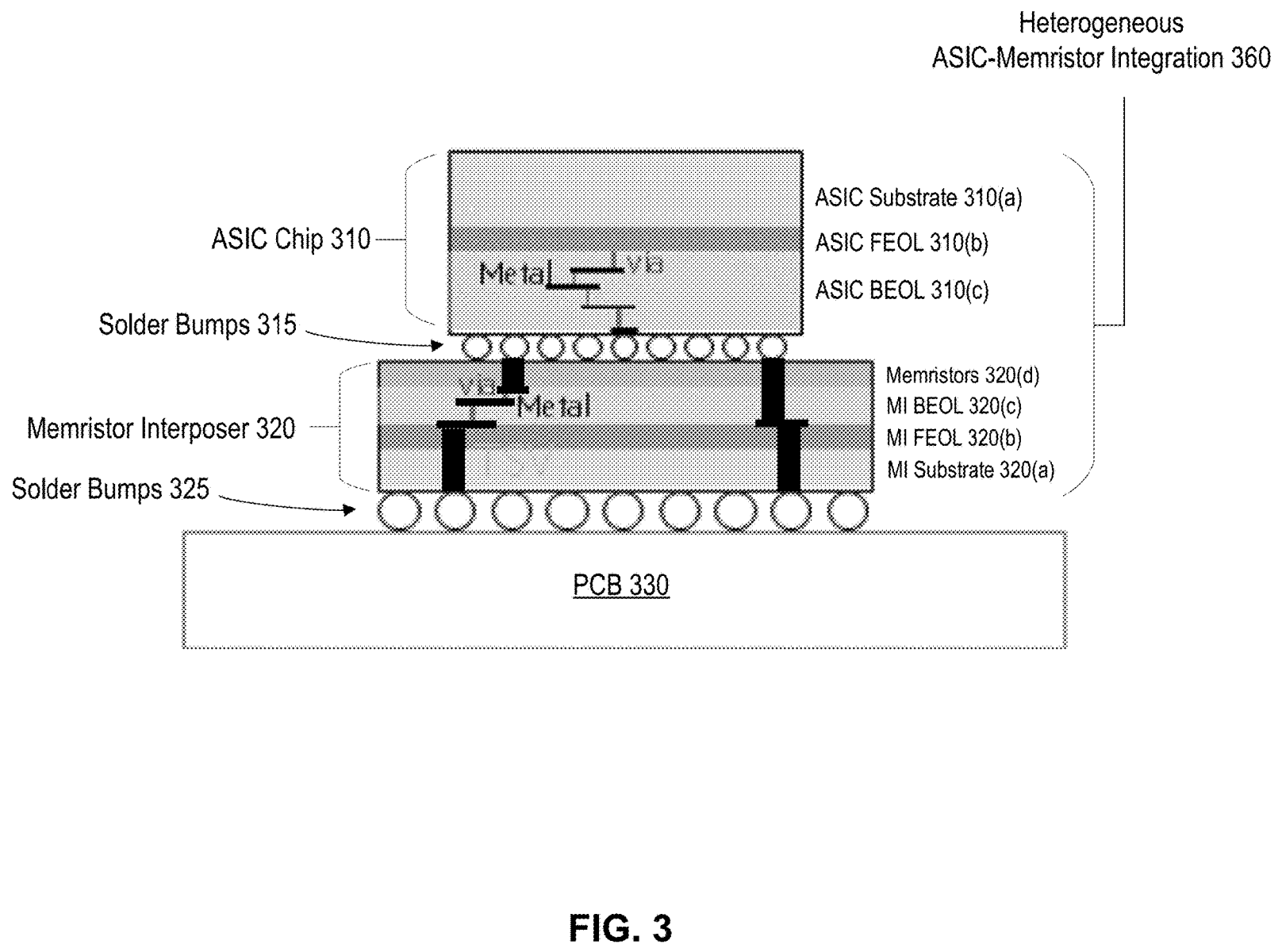

Heterogeneous
ASIC-Memristor Integration 360

ASIC Substrate 310(a)

ASIC FEOL 310(b)

ASIC BEOL 310(c)

Memristors 320(d)

MI BEOL 320(c)

MI FEOL 320(b)

MI Substrate 320(a)

Metal

Metal

PCB 330

ASIC Chip 310

Solder Bumps 315

Memristor Interposer 320

Solder Bumps 325

FIG. 3

HETEROGENEOUS INTEGRATION FOR MEMRISTOR-BASED HARDWARE ACCELERATORS

BACKGROUND

Memristors are electrical devices that maintain the state of (i.e., "remember") programmed resistances. Accordingly, memristors have been leveraged in various applications for their non-volatile memory capabilities. In various implementations, memristors are incorporated into arrays of memory cells—which may be referred to herein as memristor arrays.

In certain applications, memristors/memristor arrays are used in conjunction with application-specific integrated circuits (ASICs). These applications integrate memristors and ASIC onto a single chip—and may be referred to herein as single chip ASIC-memristor integrations. Single chip ASIC-memristor integration can be desirable due to its relatively small form factor and simplicity of design.

BRIEF DESCRIPTION OF THE DRAWINGS

The present disclosure, in accordance with one or more various examples, is described in detail with reference to the following figures. The figures are provided for purposes of illustration only and merely depict examples.

FIG. 3 depicts another example heterogeneous ASIC-memristor integration, in accordance with various examples of the present technology.

Figure 1:
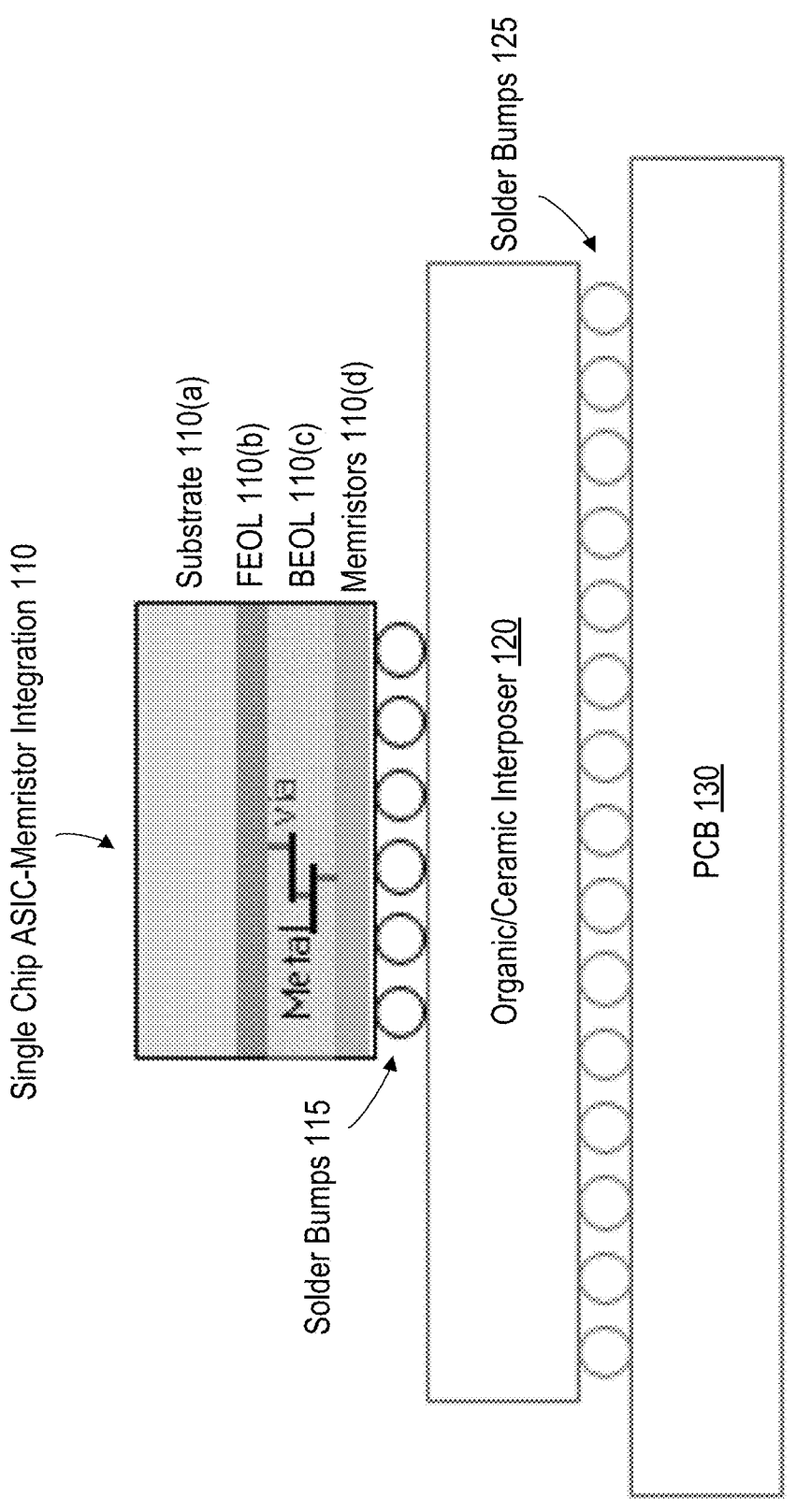
FIG. 1 depicts an example single chip ASIC-memristor integration.

The figures are not exhaustive and do not limit the present disclosure to the precise form disclosed.

DETAILED DESCRIPTION

As alluded to above, memristors/memristor arrays can be used in conjunction with application-specific integrated circuits (ASICs). These applications integrate memristors and ASIC onto a single chip—and may be referred to herein as single chip ASIC-memristor integrations. Single chip ASIC-memristor integration can be desirable due to its relatively small form factor and simplicity of design.

In conventional single chip ASIC-memristor integrations, memristor arrays are primarily used for their non-volatile memory storage capabilities. Such conventional applications typically program memristors in a binary fashion (i.e., high resistance or low resistance). Such simple programming can generally be achieved with low voltage, low current, and small form factor devices—which is conducive/advantageous for single chip ASIC-memristor integrations as ASICs are generally improved/optimized using advanced complementary metal-oxide-semiconductor (CMOS) technology nodes that operate at low voltages/low currents and smaller form factors.

However, as examples of the present technology are designed in appreciation of, through more complex/higher precision memristor programming, memristor arrays can play a new and exciting role as hardware accelerators that perform/facilitate computations. Such precision memristor programming (including tight tolerance and wide conductance range memristor programming), generally requires higher voltage, higher current, and larger form factor devices. For example, memristors may be programmed in an analog fashion to leverage memristor arrays for performing complex computations—which is a departure from their more conventional usage as non-volatile memory storage. In general, increasing (i.e., finer) memristor programming precision allows memristor arrays to perform/facilitate computations with increasing complexity. However (and as alluded to above), increasing memristor programming precision generally requires higher voltage (e.g., 1.5 volts and above), higher current, and larger form factor devices. This emerging requirement presents a problematic design trade-off for single chip ASIC-memristor integrations because (as alluded to above), ASICs are generally improved/optimized using advanced CMOS technology nodes that operate at lower voltages (e.g., 0.9 volts and below), lower currents, and smaller form factors. Again, such a trade-off had generally not been required (or considered) for conventional/simpler memristor array memory-storage applications which could be achieved using relatively lower voltage, lower current, and smaller form factor devices for memristor programming.

Against this backdrop, examples of the present technology provide heterogeneous (i.e., multi-chip) ASIC-memristor integrations that enable high voltage (e.g., 1.5 volts and above) and high current-dependent precision memristor programming while preserving optimal ASIC performance/capabilities. Examples achieve these advantages by "decoupling" memristor hardware from ASIC chip. Accordingly, a heterogeneous ASIC-memristor integration of the present technology may comprise an ASIC chip packaged onto a functional "memristor-interposer" chip. The memristor interposer may serve both a functional and structural purpose. Namely, a memristor array of the memristor interposer can be leveraged in conjunction with the ASIC for processing/computation functions—while connections within the memristor interposer route signals between ASIC and computing system (e.g., between the ASIC and a printed circuit board (PCB)).

By de-coupling memristors from the ASIC chip, examples of the present technology can separately optimize design parameters for both the memristor interposer and ASIC chip. For example, advanced (i.e., lower voltage, lower current, and smaller form factor) CMOS technology nodes may be used for the ASIC chip—thereby improving/optimizing ASIC performance/capabilities. The smaller ASIC chip utilizing the advanced CMOS technology node may also be significantly less costly than the larger ASIC chips required for single chip ASIC-memristor integrations. Meanwhile, the memristor interposer can house high voltage/high current/larger form factor devices used for programming memristors with increasing analog precision. With such precision memristor programming, memristor arrays of the present technology can be used in conjunction with an ASIC to perform higher complexity computations than conventional single-chip ASIC-memristor integrations.

By leveraging a "functional" memristor interposer (i.e., an interposer that "serves two needs with one deed" by functionally performing/facilitating computations while structurally providing electrical routing between ASIC and PCB), examples of the present technology can achieve more efficient designs than potential alternative de-coupling approaches. For example, a memristor interposer enables a stacked configuration for an ASIC chip and memristor interposer. Such a stacked configuration can achieve a smaller lateral form factor than potential alternative de-coupling approaches that simply flip-chip an ASIC chip and (non-interposer) memristor chip adjacently onto a common interposer that interfaces with a PCB (i.e., a PCB-interfacing interposer). Relatedly, as compared to these potential alternative de-coupling approaches, examples of the present technology can simplify design/electrical routings for the PCB-interfacing interposer—thereby reducing costs for the PCB-interfacing interposer, and in some cases improving performance for the overall system due to simplified electrical routing between memristors/memristor array and ASIC chip. Moreover, in certain implementations the memristor interposer may obviate the need for a separate PCB-interfacing interposer (see e.g., FIG. 3)—thus further simplifying design/reducing form factor for the heterogenous ASIC-memristor integrations of the present technology.

In various implementations, the present technology can leverage "flip-chip" packaging (or similar) techniques to package the ASIC chip with the memristor interposer (as used herein, flip-chip packaging may refer to techniques for interconnecting chips with solder bumps deposited on contact pads of the chips). For example, a first plurality of solder bumps (or similar connections such as metallic pillars, wires, etc.) may operatively connect a plurality of ASIC chip contact pads located on a memristor interposer-facing surface of an ASIC chip with a first plurality of memristor interposer pads located on a ASIC chip-facing surface (e.g., top surface) of a memristor-interposer. A second plurality of solder bumps (or similar connections such as metallic pillars, wires, etc.) may then operatively connect a second plurality of memristor interposer pads located on a computing system-facing surface (e.g., bottom surface) of the memristor-interposer with a plurality of computing system contact pads. Here, the computing system contact pads may be located on a memristor interposer facing-surface of an organic/ceramic interposer that interfaces the memristor interposer with a PCB. A memristor array of the memristor interposer may be operatively connected to one or more contact pads of the first plurality of memristor interposer contact pads—thereby operatively connecting the memristor array to the ASIC chip.

As alluded to above, the memristor interposer plays a structural role in addition to its functional role as a hardware accelerator. Namely, the memristor interposer operatively/structurally connects computing system (e.g., PCB+organic/ceramic interposer) to ASIC chip—facilitating signal transmission between the computing system and ASIC chip. Accordingly, the memristor interposer may comprise through-silicon vias (TSVs) that electrically connect contact pads of the second plurality of memristor interposer contact pads (operatively connected to the computing system) to contacts pads of the first plurality of memristor interposer contact pads (operatively connected to the ASIC chip). As will be described below, the first plurality of memristor interposer contact pads (and by extension the first plurality of solder bumps) may have smaller size and finer pitch than the second plurality of memristor interposer contact pads (and by extension the second plurality of solder bumps). Accordingly, contact pads of the first plurality of memristor interposer contact pads may not align with corresponding contact pads of the second plurality of memristor interposer contact pads. To address this design challenge, TSVs in the memristor interposer may leverage (horizontal) redistribution layers (RDLs). For example, a memristor interposer TSV may comprise: (1) a first TSV segment connecting a contact pad of the second plurality of memristor interposer to a first contact point of an RDL; (2) the RDL; and (3) a second TSV segment connecting a second contact point of the RDL with a contact pad of the first plurality of memristor interposer contact pads.

De-coupled from an advanced (i.e., lower voltage, lower current and smaller form factor) CMOS technology node of the ASIC chip, the memristor interposer can include high voltage/high current/larger form factor devices used to program memristors with (fine) analog precision. For example, such high voltage devices may include transistors operating at or above 1.5 volts (some specific implementations may involve operation at about 2.5 volts or as high as 5.5 volts). Again, incorporating such high voltage/high current devices onto a ASIC chip would generally foreclose (or make difficult) usage of advanced (i.e., lower voltage, lower current, and smaller form factor) CMOS technology nodes—thereby reducing ASIC performance/capabilities.

Accordingly, by de-coupling memristors and memristor programming circuitry from the ASIC chip, heterogenous ASIC-memristor integrations of the present technology can preserve optimal ASIC performance/capabilities (through use of advanced CMOS technology nodes on the ASIC chip) while enabling finer precision (and higher voltage/high current-dependent) memristor programming. Again, finer precision memristor programming can allow the present heterogenous ASIC-memristor integrations to perform/support more complex computations. Moreover, use of advanced (i.e., lower voltage, lower current, and smaller form factor) technology nodes for the ASIC chip can promote faster-switching speed and smaller input sensitivity for the ASIC chip—thereby improving ASIC performance as well. Accordingly, the heterogenous ASIC-memristor integrations of the present technology may be used in cutting-edge applications (e.g., certain artificial intelligence and machine learning applications) involving computations too complex for conventional single chip ASIC-memristor integrations.

As examples of the present technology are designed in appreciation of, de-coupling memristors from the ASIC chip can result in further design and fabrication optimizations for ASIC-memristor integrations.

For example, the ASIC chip can leverage a larger metal stack (e.g., 8-10 metal layers) than the memristor interposer (which may utilize, e.g., only 3-4 metal layers). Here, a larger metal stack may improve/optimize ASIC performance by reducing IR drop (i.e., voltage drop). Additionally, a larger metal stack can also improve ASIC chip design by enabling easier signal/power routing. By contrast, the memristor interposer can be designed with a smaller metal stack that minimizes via/metal parasitics between metal stack and memristors—thereby improving performance/reliability for the memristors.

As another example, and as the present technology is designed in appreciation of, certain memristor technologies can be improved/optimized using unconventional materials/processes that have yet to be incorporated in the advanced CMOS technology nodes used to optimize/improve ASIC performance. For example, some types of memristors require inert metal electrodes and specific oxide stoichiometry for switching material—neither of which are standard for advanced CMOS foundries. Accordingly, by decoupling memristors from ASIC, the present technology can utilize these unconventional materials/processes on the memristor interposer, without sacrificing ASIC performance.

Heterogenous ASIC-memristor integrations of the present technology may also provide certain fabrication-level advantages over conventional single-chip ASIC-memristor integrations. For example, conventional single-chip ASIC-memristor integrations can involve one foundry attaching memristors to a chip provided by another foundry. Aligning contact points from the chip with contact points of the memristors can be challenging and tedious. By contrast, heterogenous ASIC-memristor integrations of the present technology can take advantage of well-proven fabrication techniques such as flip-chip packaging to integrate ASIC chip with memristor interposer—thereby simplifying/optimizing the fabrication process. Relatedly, by utilizing two separate chips (i.e., the ASIC chip and the memristor interposer), ASIC-memristor integrations of the present technology may provide greater flexibility for scheduling and choosing foundry services.

Heterogenous ASIC-memristor integrations of the present technology also can provide flexible re-use applications. For example, either of the memristor interposer and ASIC chip can be re-used in new applications/new integrations. By contrast, the ASIC of a single chip ASIC-memristor integration could not generally be re-used with a different set of memristors/memristor array. Similarly, memristors of a single chip ASIC-memristor integration could not generally be re-used with a different ASIC.

Before describing examples of the present technology in more detail, it should be understood that de-coupling memristors from an ASIC comes with certain design-related drawbacks and challenges. For example, decoupling memristors from an ASIC in ASIC-memristor integrations can introduce additional parasitics that tend to reduce performance of a memristor array (as will be described below, examples of the present technology can reduce these parasitics by incorporating a purpose-designed metal stack for the memristor interposer that reduces resistor-capacitor (RC) parasitics). Accordingly, in many conventional ASIC-memristor integrations, single-chip integration may still be more desirable due to its simpler design, smaller form factor (i.e., one chip vs. two chips), and relative lack of parasitics. However, as examples of the present technology are designed in appreciation of, in emerging memristor technologies where higher voltage/higher current devices are required for precision/analog memristor programming—the benefits of de-coupling memristors from ASIC can outweigh associated drawbacks/challenges. Accordingly, by de-coupling memristors from ASIC for these emerging/unique applications, the present technology can preserve optimal ASIC performance/capabilities (through use of advanced CMOS technology nodes) while enabling finer precision (and higher voltage/higher current-dependent) memristor programming—thereby enabling the heterogenous ASIC-memristor integration to perform computations with increasing complexity. Moreover, examples of the present technology intelligently mitigate form factor increases associated with using separate chips for ASIC and memristors by incorporating the memristors into a "functional" memristor interposer (i.e., a chip that serves both a structural/interposer function and a functional/hardware accelerating function). Thus, examples of the present technology can achieve smaller form factors than potential alternative de-coupling technologies that flip-chip a (non-interposer) memristor chip and an ASIC chip adjacently onto a common PCB-interfacing interposer.

FIG. 1 depicts an example single chip ASIC-memristor integration 110. Single chip ASIC-memristor integration 110 may be an example of an existing single chip ASIC-memristor integration.

Before describing single chip ASIC-memristor integration 110 in more detail, it may be useful to describe how single chip ASIC-memristor integration 110 connects/interfaces with the other devices depicted in FIG. 1.

As depicted, single chip ASIC-memristor integration 110 may be connected to a printed circuit board (PCB) 130 via an organic/ceramic interposer 120.

As alluded to above, an interposer may refer to a material/device that interfaces two electrical devices. In other words, the interposer provides electrical interface routing between the two electrical devices. In general, interposers are used to spread a connection to a wider pitch and/or re-route non-aligned connections between the two electrical devices. Accordingly, organic/ceramic interposer 120 may be an organic and/or ceramic interposer that interfaces single chip ASIC-memristor integration 110 with PCB 130. Conventional interposers—such as organic/ceramic interposer 120—generally only serve a structural/electrical conduit role. However, as alluded to above (and as will be described in greater detail in conjunction with FIG. 2), a memristor interposer of the present technology may play a functional (i.e., hardware accelerating) role as well. Namely, the memristor interposer of the present technology can perform/facilitate complex computations—in addition to its role as an electrical conduit between a computing system and ASIC chip. Through this unconventional dual role, the memristor interposer of the present technology can enable more efficient designs than potential alternative de-coupling approaches. For example, a memristor interposer enables a stacked configuration for an ASIC chip and memristor interposer. Such a stacked configuration may achieve a smaller lateral form factor than potential alternative de-coupling approaches that simply flip-chip an ASIC chip and (non-interposer) memristor chip adjacently onto a common PCB-interfacing interposer. Relatedly, as compared to these potential alternative de-coupling approaches, examples of the present technology can simplify design/electrical routings for the PCB-interfacing interposer—thereby reducing costs for the PCB-interfacing interposer, and in some cases improving performance for the overall system due to simplified electrical routing between memristor array and ASIC chip. Moreover, in certain implementations the memristor interposer may obviate the need for a separate PCB-interfacing interposer (see e.g., FIG. 3)—thus further simplifying design/reducing form factor for heterogenous ASIC-memristor integrations of the present technology.

PCB 130 may be a printed circuit board associated with a larger computing system—of which single chip ASIC-memristor integration 110 is a part. Accordingly, PCB 130 and organic/ceramic interposer 120 (which interfaces single chip ASIC-memristor integration 110 with PCB 130) may be referred to herein as "the computing system." As depicted, the computing system and single chip ASIC-memristor integration 110 can exchange digital and/or analog signals via organic/ceramic interposer 120. For example, the computing system may leverage single chip ASIC-memristor integration 110 to perform a specific computation by first transmitting input/instructions signals to single chip ASIC-memristor integration 110 via organic/ceramic interposer 120. Upon performing the requested computation, single ASIC-memristor integration 110 may then transmit output signals to the larger computing system via organic/ceramic interposer 120.

FIG. 1 depicts operative connections between devices characteristic of flip-chip packaging. As alluded to above, flip-chip packaging may refer to techniques for interconnecting chips with solder bumps (i.e., metallic connections) deposited on contact pads (as used herein, contact pads may refer to electrical interface connections/sockets) of the chips.

While pluralities of solder bumps 115 and 125 are depicted as balls in the specific example of FIG. 1, in various implementations they may comprise metallic contacts of different forms (e.g., metal pillars, wires, etc.).

As depicted, the plurality of solder bumps 115 operatively connects a plurality of ASIC chip contact pads located at a computing system-facing surface of single chip ASIC-memristor integration 110 (i.e., the surface of single chip ASIC-memristor integration 110 facing organic/ceramic interposer 120 and PCB 130) with a first plurality of interposer contact pads located at a single chip ASIC-memristor integration 110-facing surface of organic/ceramic interposer 120. Relatedly, the plurality of solder bumps 125 operatively connects a second plurality of interposer contact pads located at a PCB 130-facing surface of organic/ceramic interposer 120 with contact pads of PCB 130.

While in the specific example of FIG. 1 single chip ASIC-memristor integration 110 is operatively connected to PCB 130 using flip-chip packaging, in other implementations the operative connection may be achieved via alternative techniques (e.g., wire bonding, etc.).

Referring now to single chip ASIC-memristor integration 110, single chip ASIC-memristor integration 110 may comprise: (1) a substrate 110(*a*); (2) a front end of line (FEOL) layer 110(*b*); (3) a back end of line layer 110(*c*); and (4) a memristor array 110(*d*). While in the specific example of FIG. 1 memristor array 110(*d*) is depicted below BEOL layer 110(*c*), in various implementations memristor array 110(*d*) may be incorporated within BEOL layer 110(*d*), or between FEOL layer 110(*b*) and BEOL layer 110(*d*).

Single chip ASIC-memristor integration 110 may be fabricated using conventional integrated circuit (IC) fabrication techniques. For example, a FEOL process may form FEOL layer 110(*b*) on substrate 110(*a*) (here, it should be understood that because single chip ASIC-memristor integration 110 is "flip-chipped" onto organic/ceramic interposer 120, as depicted single chip ASIC-memristor integration 110 has an opposite orientation to its fabrication orientation). A BEOL process may then form BEOL layer 110(*c*) on FEOL layer 110(*b*). Memristor array 110(*d*) may then be connected to the metal interconnects of BEOL layer 110(*c*)—thus connecting memristor array 110(*d*) to an ASIC associated with FEOL layer 110(*b*)/BEOL layer 110(*c*). As alluded to above, while not depicted, in various implementations memristor array 110(*d*) may be incorporated within BEOL layer 110(*c*), or positioned between FEOL layer 110(*b*) and BEOL layer 110(*c*). Each of the layers/components of single chip ASIC-memristor integration 110 will be described in greater detail below.

As alluded to above, a FEOL process may form FEOL layer 110(*b*) on substrate 110(*a*). In the FEOL process, electrical components of the ASIC (e.g., transistors, resistors, capacitors, etc.) are patterned in semiconductor material of FEOL layer 110(*b*). In single chip ASIC-memristor integration 110, the electrical components formed in FEOL layer 110(*b*) may also include transistors and/or other electrical components required for programming memristor array 110(*d*). As alluded to above, when memristor arrays are used by convention—i.e., for their non-volatile memory capabilities—the electrical components required for memristor programming can be relatively low voltage (e.g., 0.9 volts and below), low current, and small form factor devices. This is advantageous/conducive for single chip ASIC-memristor integrations as modern ASICs generally utilize advanced (i.e., low voltage, lower current, and smaller form factor) CMOS technology nodes. These advanced CMOS technology nodes can generally fit, and are generally compatible with the low voltage/lower current/small form factor devices used for conventional/simplistic memristor programming. However, as examples of the present technology are designed in appreciation of, through more complex/higher precision analog programming, memristor arrays can play a new and exciting role as hardware accelerators that perform/facilitate complex computations. Increasing memristor programming precision generally requires higher voltage, higher current, and larger form factor devices. This emerging requirement presents a problematic design trade-off for single chip ASIC-memristor integrations because (as alluded to above), ASICs are generally improved/optimized using advanced CMOS technology nodes that operate at low voltages, low currents, and smaller form factors. Again, such a trade-off had generally not been required (or considered) for conventional/simpler memristor array memory-storage applications which could be achieved using relatively lower voltage/lower current/smaller form factor devices for memristor programming. Here, it may be noted that in some cases analog/precision memristor programming can be achieved with lower voltage devices—but over a longer time period. Accordingly, by enabling higher voltage analog/precision memristor programming, examples of the present technology can facilitate faster memristor programming than lower voltage alternatives. Such increased speed for analog/precision memristor programming can be especially valuable in applications (e.g., machine learning applications) where memristors need to be reprogrammed frequently. In these applications, increased speed for memristor programming can reduce latency associated with (frequent) reprogramming.

Referring again to single chip ASIC-memristor integration 110, after electrical components have been formed in FEOL layer 110(*b*), a BEOL process may form BEOL layer 110(*c*). BEOL layer 110(*c*) may provide the metal interconnects that allow electrical components in FEOL layer 110(*b*) to communicate with each other, memristor array 110(*d*), and the outside world. For example, holes vertically etched through layers of deposited dielectric material may be filled with metal to form the metal interconnects of BEOL layer 110(*c*). These vertical metal interconnects (passing through the dielectric layers of BEOL layer 110(*c*)) may be referred to as vias. The number of (vertical) layers of vertical metal interconnects/vias in BEOL layer 110(*c*) may be referred to as the "metal layers" of BEOL layer 110(*c*). In some cases, horizontal redistribution layers (RDLs) in BEOL layer 110 (*c*) may be used to re-route vias within BEOL layer 110(*c*). In various implementations, electrical components (e.g., inductors, capacitors, resistors, etc.) may also be formed in BEOL layer 110(*c*).

Memristor array 110(*d*) may be an array of memristors. As alluded to above, memristors are electrical devices that maintain the state of (i.e., "remember") programmed resistances. Examples of memristors include 2-terminal non-volatile memory devices based on resistance programming/switching. Accordingly, memristors/memristor arrays have been leveraged in various applications for their non-volatile memory capabilities. However, as examples of the present technology are designed in appreciation of, through more complex/higher precision analog memristor programming, memristor arrays can play a new and exciting role as hardware accelerators that perform/facilitate complex computations. Increasing programming precision generally requires higher voltage, higher current, and larger form factor devices. This emerging requirement presents a problematic design trade-off for single chip ASIC-memristor integrations because (as alluded to above), ASICs are generally improved/optimized using advanced CMOS technology nodes that operate at low voltages, low currents, and smaller form factors. Again, such a trade-off had generally not been required (or considered) for conventional/simpler memristor array memory-storage applications which could be achieved using relatively lower voltage, lower current, and smaller form factor devices for memristor programming.

However (and as will be described in greater detail in conjunction with FIG. 2), by de-coupling memristors from ASIC for these emerging/unique applications, the present technology can preserve optimal ASIC performance/capabilities (through use of advanced CMOS technology nodes) while enabling finer precision (and higher voltage/higher current-dependent) memristor programming—thereby enabling the heterogenous ASIC-memristor integration to perform computations with increasing complexity. Moreover, examples of the present technology mitigate form factor increases associated with using separate chips for ASIC and memristors by incorporating memristors into a "functional" memristor interposer (i.e., a chip that serves both a structural/interposer function and a functional/hardware accelerating function). Thus, examples of the present technology can achieve smaller form factors than potential alternative de-coupling technologies that flip-chip a (non-interposer) memristor chip and an ASIC chip adjacently onto a common PCB-interfacing interposer (e.g., organic/ceramic interposer 120).

Figure 2:
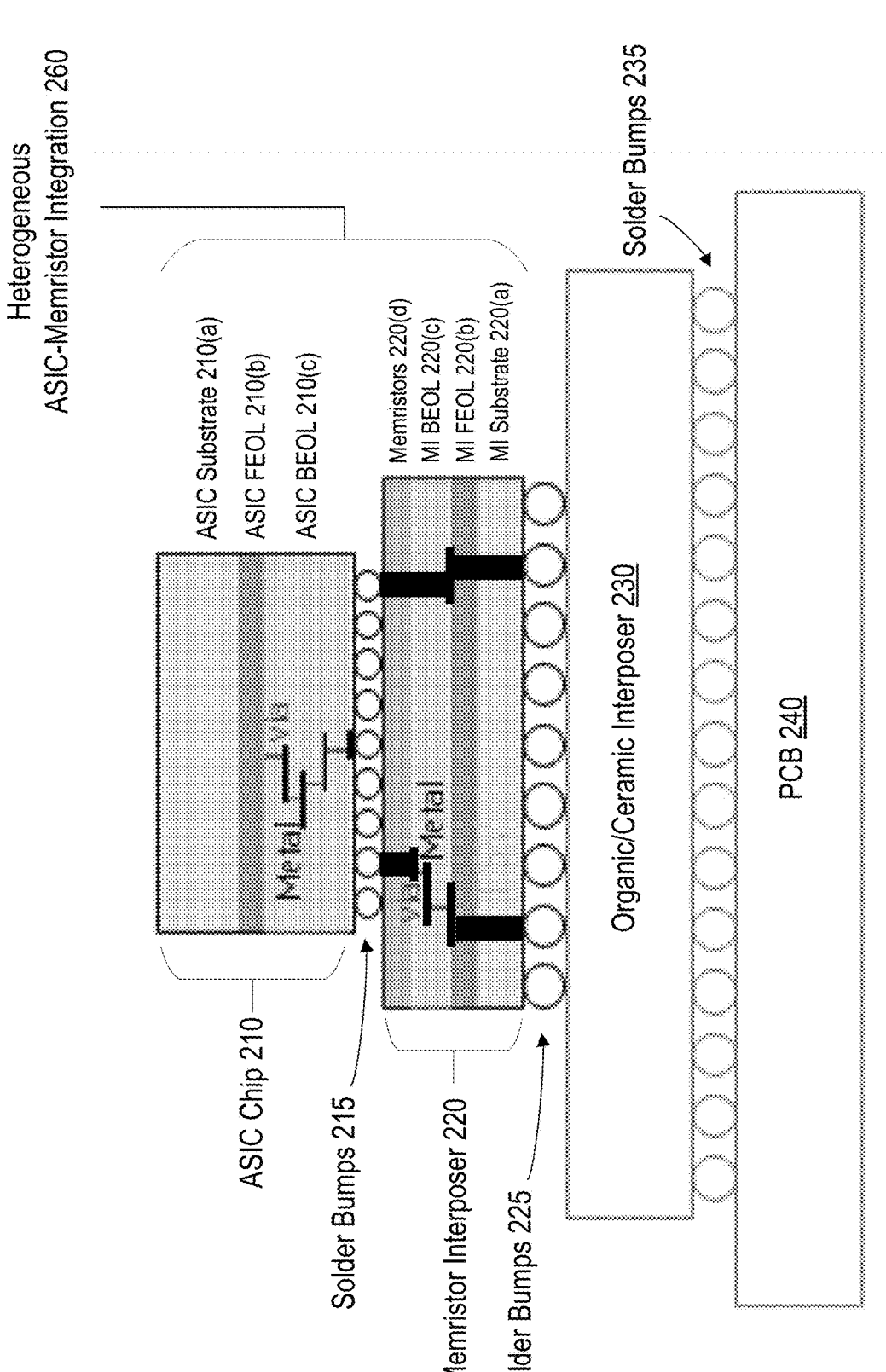
FIG. 2 depicts an example heterogeneous ASIC-memristor integration, in accordance with various examples of the present technology.

FIG. 2 depicts an example heterogeneous ASIC-memristor integration 260, in accordance with various examples of the present technology.

As depicted, heterogeneous ASIC-memristor integration 260 comprises an ASIC chip 210 and a memristor interposer 220. Before describing the various components of FIG. 2 in more detail, a few general notes follow.

Unlike single chip ASIC-memristor integration 110, ASIC chip 210 does not include memristors or memristor programming circuitry/components. Accordingly, ASIC chip 210 can utilize an advanced (i.e., lower voltage, lower current, and smaller form factor) CMOS technology node—without restricting memristor programming ability. That is, because the higher voltage/higher current/larger form factor electrical components required for programming memristors with analog precision can be housed on memristor interposer 220 instead of ASIC chip 210, ASIC chip 210 can utilize a more advanced and smaller form factor CMOS technology node than memristor interposer 220. This relative difference in form factor between ASIC chip 210 and memristor 220 is depicted in FIG. 2 for illustration.

Like single chip ASIC-memristor integration 110, heterogenous ASIC-memristor integration 260 may be connected to a printed circuit board (PCB) 240 via an organic/ceramic interposer 230. Here, PCB 240 and organic/ceramic interposer 230 may be the same/similar as PCB 130 and organic/ceramic interposer 120 of FIG. 1 respectively.

For example, organic/ceramic interposer 230 may be an organic and/or ceramic interposer that interfaces heterogenous ASIC-memristor integration 260 with PCB 240. Conventional interposers—such as organic/ceramic interposer 230—generally only serve a structural/electrical conduit role. However, as alluded to above (and as will be described in greater detail in conjunction with FIG. 2), memristor interposer 220 may play a functional (i.e., hardware accelerating) role as well. Namely, memristor interposer 220 can perform/facilitate complex computations—in addition to its role as an electrical conduit between computing system (i.e., PCB 240 and organic/ceramic interposer 230) and ASIC chip 210. Through this unconventional dual role, memristor interposer 220 can enable smaller form factor ASIC-memristor integrations than potential alternative de-coupling technologies that flip-chip a (non-interposer) memristor chip and an ASIC chip adjacently onto a common PCB-interfacing interposer (e.g., organic/ceramic interposer 230). Relatedly, because memristor interposer 220 spreads electrical connections of the advanced/smaller form factor CMOS technology node of ASIC chip 210 to a wider pitch—as illustrated by the larger size and wider pitch of plurality of solder bumps 225 as compared plurality of solder bumps 215—design of organic/ceramic interposer 230 may be simplified, thereby reducing costs for organic/ceramic interposer 230. Moreover, in certain implementations (see e.g., FIG. 3) organic/ceramic interposer 230 may be omitted, and memristor interposer 220 may provide the electrical interface routing between heterogenous ASIC-memristor integration 260 and PCB 240. In such implementations the form factor and complexity of memristor interposer 220 may be increased to accommodate the required electrical interface routing.

In some examples, PCB 240 may be a printed circuit board associated with a larger computing system—of which heterogenous ASIC-memristor integration 260 is a part. Accordingly, PCB 240 and organic/ceramic interposer 230 (which interfaces heterogenous ASIC-memristor integration 260 with PCB 240) may be referred to herein as "the computing system." As depicted, the computing system and heterogenous ASIC-memristor integration 260 can exchange digital and/or analog signals via organic/ceramic interposer 230. For example, the computing system may leverage heterogenous ASIC-memristor integration 260 to perform a specific computation by first transmitting input/instructions signals to heterogenous ASIC-memristor integration 260 via organic/ceramic interposer 230. Upon performing the requested computation, heterogenous ASIC-memristor integration 260 may then transmit output signals to the larger computing system via organic/ceramic interposer 230.

FIG. 2 depicts operative connections characteristic of flip-chip packaging. As alluded to above, flip-chip packaging may refer to techniques for interconnecting chips with solder bumps (i.e., metallic connections) deposited on contact pads (as used herein, contact pads may refer to electrical interface connections/sockets) of the chips. While pluralities of solder bumps 215, 225, and 235 are depicted as balls in the specific example of FIG. 2, in various implementations they may comprise metallic contacts of different forms (e.g., metal pillars, wires, etc.).

As depicted, the plurality of solder bumps 215 operatively connect a plurality of ASIC chip contact pads located on a memristor interposer 220-facing surface of ASIC chip 210 to a first plurality of memristor interposer contact pads located on a ASIC chip 210-facing surface of memristor interposer 220. Relatedly, the plurality of solder bumps 225 operatively connects a second plurality of memristor interposer contact pads located at a computing system-facing surface of memristor interposer 220 (i.e., the surface of memristor interposer 220 facing organic/ceramic interposer 230 and PCB 240) with a first plurality of organic/ceramic interposer contact pads located at a memristor interposer 220-facing surface of organic/ceramic interposer 230. The plurality of solder bumps 235 operatively connects a second plurality of organic/ceramic interposer contact pads located at a PCB 240-facing surface of organic/ceramic interposer 230 with contact pads of PCB 240. In this way, heterogenous ASIC-memristor integration 260 (including the constituent chips of heterogenous ASIC-memristor integration 260) may be operatively connected to the larger computing system associated with PCB 240.

As depicted (and as alluded to above), the plurality of solder bumps 215 may be smaller and have a finer pitch than the plurality of solder bumps 225. This design feature relates to memristor interposer 220's structural role as an interposer. As alluded to above, interposers are generally used to spread electrical connections to a wider pitch and/or re-route non-aligned connections between two electrical devices. Here, memristor interposer 220 performs such a role— namely spreading electrical connections of the advanced/ smaller form factor CMOS technology node of ASIC chip 210 to a wider pitch. With memristor interposer 220 performing such function, the design of organic/ceramic interposer 230 may be simplified—thereby reducing costs for the organic/ceramic interposer used in conjunction with heterogenous ASIC-memristor integration 260. Relatedly, in certain implementations organic/ceramic interposer 230 and solder bumps 235 may be omitted (see e.g., FIG. 3) and memristor interposer 220 may provide the electrical interface routing between heterogenous ASIC-memristor integration 260 and PCB 240. In such implementations the form factor and complexity of memristor interposer 220 may be increased to accommodate the required electrical routing.

While the specific example of FIG. 2 depicts a flip-chipping packaging design, in other implementations alternative techniques (e.g., wire bonding, etc.) may be used to operatively connect heterogenous ASIC-memristor integration 260 (including the constituent chips of heterogenous ASIC-memristor integration 260), organic/ceramic interposer 230, and PCB 240.

Referring now to the specific components of heterogenous ASIC-memristor integration 260, ASIC chip 210 may comprise: (1) an ASIC substrate 210(*a*); (2) an ASIC FEOL layer 210(*b*); and an ASIC BEOL layer 210(*c*).

ASIC chip 210 may be fabricated using conventional integrated circuit (IC) fabrication techniques. For example, a FEOL process may form ASIC FEOL layer 210(*b*) on ASIC substrate 210(*a*) (here, it should be understood that because ASIC chip 210 is "flip-chipped" onto memristor interposer 220, as depicted ASIC chip 210 has an opposite orientation to its fabrication orientation). A BEOL process may then form ASIC BEOL layer 210(*c*) on ASIC FEOL layer 210(*b*).

As alluded to above, a FEOL process may form ASIC FEOL layer 210(*b*) on ASIC substrate 210(*a*). In the FEOL process, electrical components of the ASIC (e.g., transistors, resistors, capacitors, etc.) are patterned in semiconductor material of ASIC FEOL layer 210(*b*). As alluded to above, unlike single chip ASIC-memristor integration 110, ASIC chip 210 does not include memristors or memristor programming circuitry/components. Accordingly, transistors and other electrical components utilized for memristor programming may not be included in ASIC FEOL layer 210(*b*). Accordingly, ASIC chip 210 (including ASIC FEOL layer 201(*b*)) can utilize a more advanced and smaller form factor CMOS technology node than memristor interposer 220. This relative difference in form factor between ASIC chip 210 and memristor 220 is depicted in FIG. 2 for illustration.

After electrical components have been formed in ASIC FEOL layer 210(*b*), a BEOL process may form ASIC BEOL layer 210(*c*). ASIC BEOL layer 210(*c*) may provide the metal interconnects that allow electrical components formed in ASIC FEOL layer 210(*b*) to communicate with each other and the outside world (including memristor interposer 220). For example, holes vertically etched through layers of deposited dielectric material may be filled with metal to form the metal interconnects of ASIC BEOL layer 210(*c*). These vertical metal interconnects (passing through the dielectric layers of ASIC BEOL layer 210(*c*)) may be referred to as vias. The number of (vertical) layers of vertical metal interconnects/vias in ASIC BEOL layer 210(*c*) may be referred to as the "metal layers" of ASIC BEOL layer 210(*c*). In some cases, horizontal redistribution layers (RDLs) in ASIC BEOL layer 210(*c*) may be used to re-route vias within ASIC BEOL layer 210(*c*). In various implementations, electrical components (e.g., inductors, capacitors, resistors, etc.) may also be formed in ASIC BEOL layer 210(*c*).

As alluded to above, ASIC chip 210 can leverage a larger BEOL layer (e.g., 8-10 metal layers) than memristor interposer 220 (which may utilize, e.g., only 3-4 metal layers in its BEOL layer). Here, a larger BEOL layer may improve/ optimize ASIC performance by reducing IR drop (i.e., voltage drop). Additionally, a larger BEOL layer can also improve ASIC chip design by enabling easier signal/power routing. By contrast, memristor interposer 220 can be designed with a smaller BEOL layer that minimizes via/ metal parasitics between metal stack and memristor array 220(*d*)—thereby improving performance/reliability for memristor array 220(*d*). For illustration, a relative difference in size/thickness for the BEOL layers of ASIC chip 210 and memristor interposer 220 is depicted in FIG. 2—with ASIC chip 210 having a thicker/larger BEOL layer (i.e., a BEOL layer having more metal layers).

Referring now to the individual layers/components of memristor interposer 220, memristor interposer comprises: (1) a memristor interposer substrate 220(*a*); (2) a memristor interposer FEOL layer 220(*b*); (3) a memristor interposer BEOL layer 220(*c*); and (4) a memristor array 220(*d*).

Like ASIC chip 210, memristor interposer 220 may be fabricated leveraging well-proven IC fabrication techniques. For example, a FEOL process may form memristor interposer FEOL layer 220(*b*) on memristor interposer substrate 220(*a*) (here, the depicted orientation for memristor interposer 220 may be the same as its fabrication orientation). A BEOL process may then form memristor interposer BEOL layer 220(*c*) on memristor interposer FEOL layer 220(*b*). Memristor array 220(*d*) may then be connected to the metal interconnects of memristor interposer BEOL layer 220(*c*). While not depicted, in various implementations memristor array 220(*d*) may be incorporated within memristor interposer BEOL layer 220(*c*), or positioned between memristor interposer FEOL layer 220(*b*) and memristor interposer BEOL layer 220(*c*).

As alluded to above, a FEOL process may form memristor interposer FEOL layer 220(*b*) on memristor interposer substrate 220(*a*). In the FEOL process, electrical components (e.g., transistors, resistors, capacitors, etc.) are patterned in semiconductor material of memristor interposer FEOL layer 220(*b*). Such electrical components may be used for memristor programming. De-coupled from ASIC chip 210, memristor interposer 220 can utilize a larger form factor CMOS technology node that can accommodate higher voltage (and higher current utilizing) electrical components. Accordingly, these high voltage electrical components (e.g., transistors operating at or above 1.5 volts—and in some implementations at about 2.5 volts or as high as 5.5 volts) may be formed in memristor interposer FEOL layer 220(*b*). Using these high voltage/high current electrical components, memristors of memristor array 220(*d*) can be programmed with increasing analog precision, enabling memristor array 220 (*d*) to perform/facilitate computations with increasing complexity. Accordingly, heterogenous ASIC-memristor integration 260 can be leveraged to perform higher complexity computations than existing single chip ASIC-memristor integrations which cannot concurrently optimize ASIC and memristor array performance.

After electrical components have been formed in memristor interposer FEOL layer 220(b), a BEOL process may form memristor interposer BEOL layer 220(c). Memristor interposer BEOL layer 220(c) may provide the metal interconnects that allow electrical components formed in memristor interposer FEOL layer 220(b) to communicate with each other and the outside world (including ASIC chip 210). For example, holes vertically etched through layers of deposited dielectric material may be filled with metal to form the metal interconnects of memristor interposer BEOL layer 220(c). These vertical metal interconnects (passing through the dielectric layers of memristor interposer BEOL layer 220(c)) may be referred to as vias. The number of (vertical) layers of vertical metal interconnects/vias in memristor interposer BEOL layer 220(c) may be referred to as the "metal layers" of memristor interposer BEOL layer 220(c). In some cases, horizontal redistribution layers (RDLs) in memristor interposer BEOL layer 220(c) may be used to re-route vias within memristor interposer BEOL layer 220 (c). In various implementations, electrical components (e.g., inductors, capacitors, resistors, etc.) may also be formed in memristor interposer BEOL layer 220(c).

As alluded to above, memristor interposer 220 can leverage a smaller BEOL layer (e.g., 3-4 metal layers) than ASIC chip 210 (which may utilize, e.g., 8-10 metal layers in its BEOL layer). Here, a smaller BEOL layer for memristor interposer 220 can minimize via/metal parasitics between metal stack and memristor array 220(d)—thereby improving performance/reliability for memristor array 220(d). That is, memristor interposer BEOL layer 220(c) can be purpose-designed to enable lower RC parasitics that would/could not typically be incorporated into an advanced CMOS technology node. By contrast, a relatively larger (and separately optimized) BEOL layer for ASIC chip 210 can improve/optimize ASIC performance by reducing IR drop (i.e., voltage drop). Additionally, a relatively larger BEOL layer for ASIC chip 210 can also improve ASIC chip design by enabling easier signal/power routing. For illustration, a relative difference in size/thickness for the BEOL layers of memristor interposer 220 and ASIC chip 210 is depicted in FIG. 2—with memristor interposer 220 having a thinner/smaller BEOL layer (i.e., a BEOL layer having fewer metal layers).

Memristor array 220(d) may be an array of memristors. It should be understood that such a memristor array can take various forms. For example, memristor array 220(d) may comprise an analog content-addressable memory (aCAM) implemented using memristors. In various examples, memristor array 220(d) may comprise an analog crossbar memristor array/analog vector-matrix multiplier. In still further examples, memristor array 220(d) may comprise a ternary CAM (TCAM), or various other types of memristor-CAM arrays.

As alluded to above, memristors are electrical devices that maintain the state of (i.e., "remember") programmed resistances. Examples of memristors include 2-terminal non-volatile memory devices based on resistance programming/switching. Accordingly, memristors have been leveraged in various applications for their non-volatile memory capabilities. However, as examples of the present technology are designed in appreciation of, through more complex/higher precision analog programming, memristors can play a new and exciting role as hardware accelerators that perform/support complex computations. Increasing programming precision generally requires higher voltage (e.g., 1.5 volts and above), higher current, and larger form factor devices. This presents a problematic design trade-off for single chip ASIC-memristor integrations because (as alluded to above), ASICs are generally improved/optimized using advanced CMOS technology nodes that operate at lower voltages (e.g., 0.9 volts and below), lower currents, and smaller form factors. Again, such a trade-off had generally not been broached (or considered) for conventional/simpler memristor array memory-storage applications which could be achieved using relatively lower voltage, lower currents, and smaller form factor devices for memristor programming.

However, by de-coupling memristors from ASIC for these emerging/unique applications, the present technology can preserve optimal ASIC performance/capabilities (through use of advanced CMOS technology nodes) while enabling finer precision (and higher voltage/higher current-dependent) memristor programming—thereby enabling the heterogenous ASIC-memristor integration to perform computations with increasing complexity. Accordingly, the memristors of memristor array 220 can be programmed with fine analog precision—thus enabling memristor array 220 to perform/facilitate computations with increasing complexity.

As alluded to above, while in the specific example of FIG. 2 memristor array 220(d) is depicted below memristor interposer BEOL layer 220(d), in various implementations memristor array 220(d) may be incorporated within memristor interposer BEOL layer 220(c), or between memristor interposer FEOL layer 220(b) and memristor interposer BEOL layer 220(c).

FIG. 2 also depicts through silicon-vias (TSVs) traversing memristor interposer 220. As used here, a TSV may refer to a via that passes completely through a chip. For example, a TSV of memristor interposer may pass through all layers of memristor interposer 220 thereby operatively connecting a contact pad of the second plurality of memristor interposer contact pads located at the computing system-facing surface of memristor interposer 220 with a contact pad of the first plurality of memristor interposer contact pads located at the ASIC chip 210-facing surface of memristor interposer 220. As depicted, such a TSV may leverage one or more RDLs in memristor interposer BEOL layer 220(c) to account for non-alignment of contact pads. That is, a TSV of memristor interposer 220 may comprise (1) a first TSV segment operatively connecting the contact pad of the second plurality of memristor interposer contact pads to a first contact point of a RDL; (2) the RDL; and (3) a second TSV segment operatively connecting a second contact point of the RDL with the contact pad of the first plurality of memristor interposer contact pads.

FIG. 3 depicts an example heterogeneous ASIC-memristor integration 360, in accordance with various examples of the present technology.

Here, heterogeneous ASIC-memristor integration 360 may be the same/similar as heterogeneous ASIC-memristor integration 260 except memristor interposer 320 provides the electrical interface routing between heterogeneous ASIC-memristor integration 360 and PCB 330. That is, a separate interposer (e.g., organic/ceramic interposer 220) may be omitted from the design of FIG. 3. As the design of FIG. 3 includes just two chips on PCB 330, the design of FIG. 3 may provide a smaller form factor than alternative designs.

Because memristor interposer 320 provides the electrical interface routing between heterogenous ASIC-memristor integration 360 and PCB 330 the form factor and complexity of memristor interposer 320 may be increased to accommodate the required electrical routing.

Figure 4:
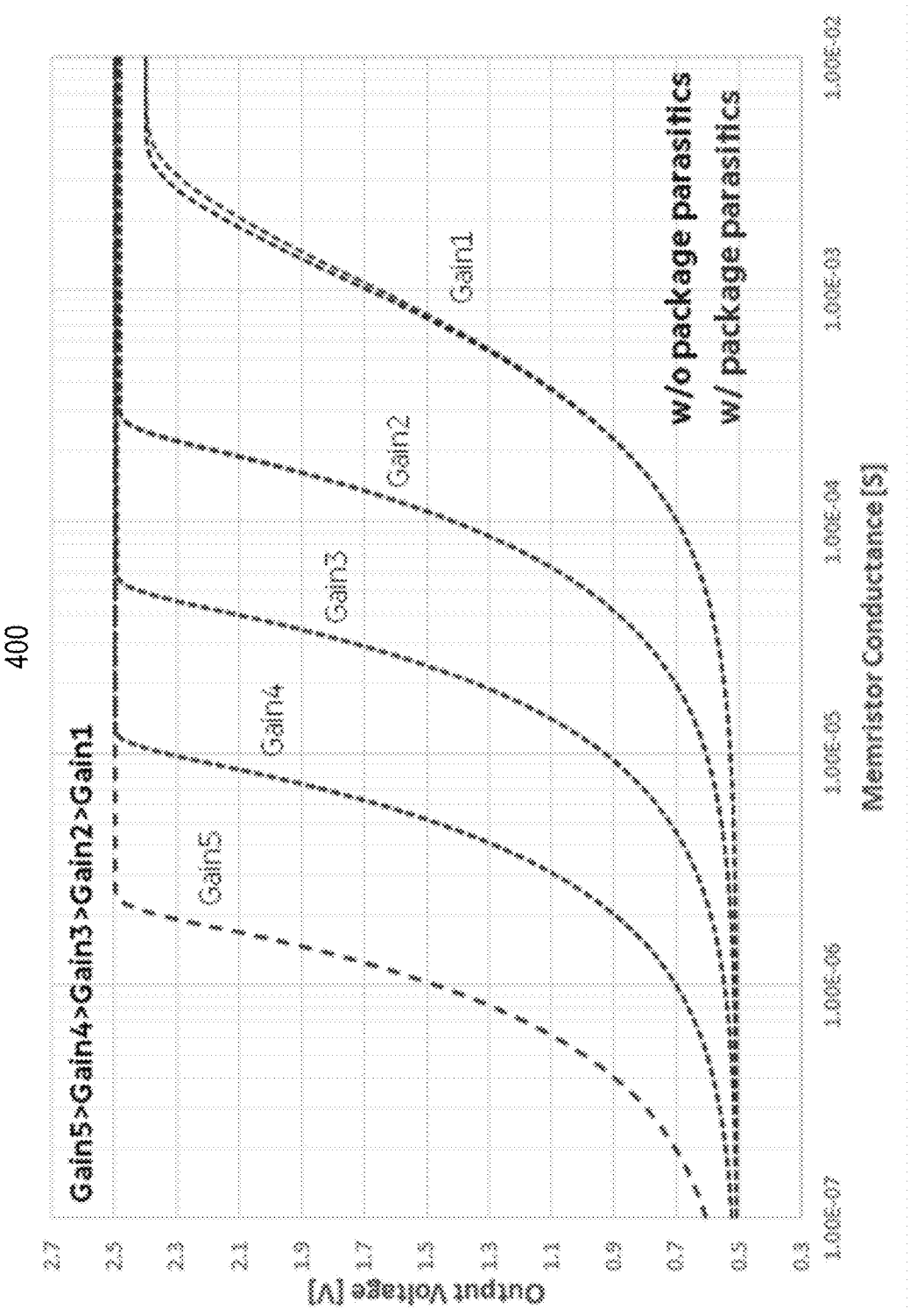
FIG. 4 depicts results from an example experiment conducted in accordance with the present technology.
Figure 5:
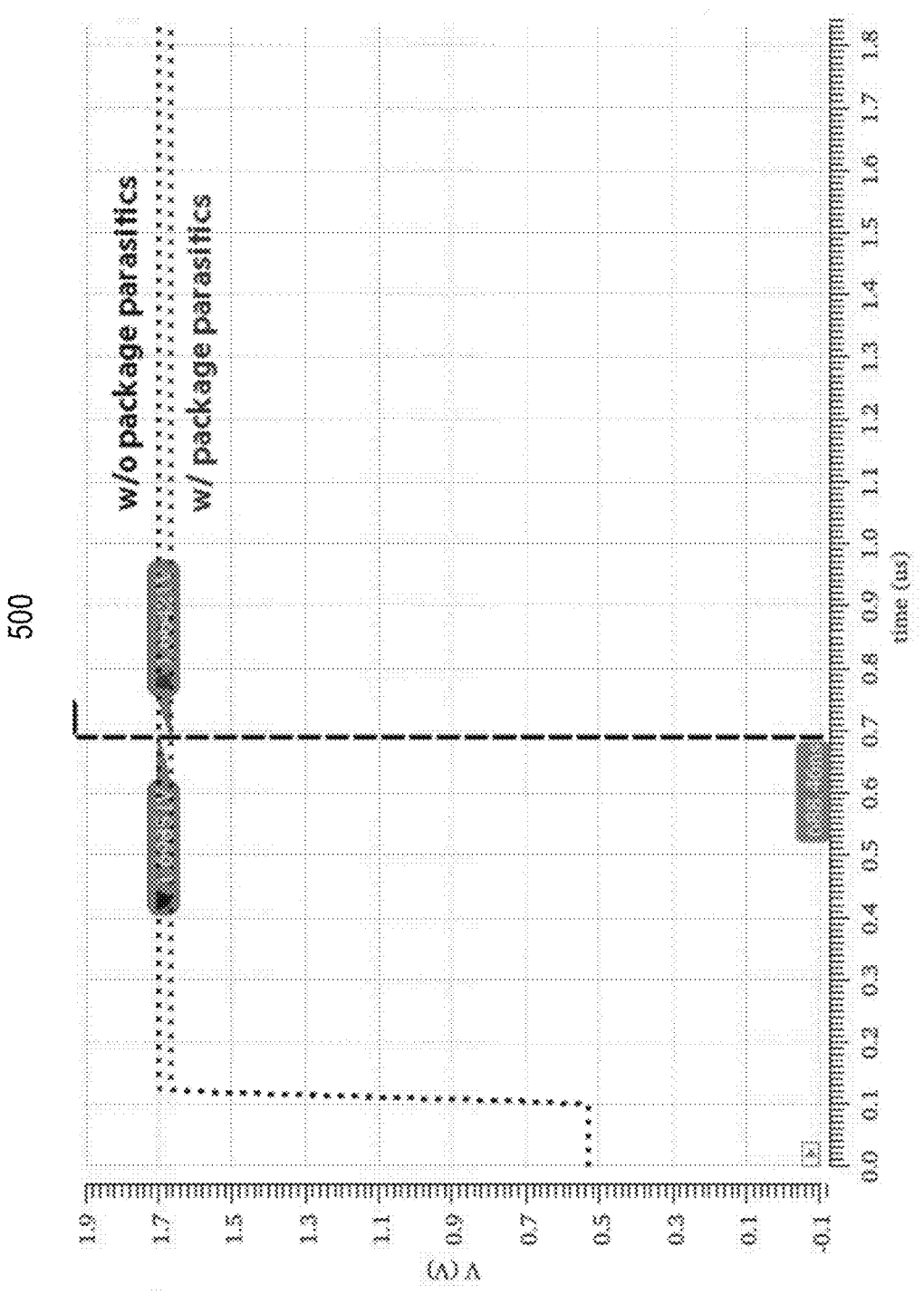
FIG. 5 depicts further results from the example experiment conducted in accordance with the present technology.

FIGS. 4 and 5 depict results from an example experiment conducted in accordance with the present technology. Namely, FIG. 4 includes a graph 400 illustrating a direct current (DC) simulation comparison during a memristor read operation for a package with and without package parasitics. FIG. 5 includes a graph 500 illustrating a time domain simulation comparison during the memristor read operation for the package with and without package parasitics.

As alluded to above, a historical limitation in decoupling memristors from ASIC in ASIC-memristor integrations has to do with the expected additional parasitics that would be introduced. These parasitics would generally tend to reduce performance of the memristor array. For example, memristors are known to be sensitive to electrostatic discharge, or current/voltage spikes, and thus significant parasitic capacitance could cause disturb issues.

However, as examples of the present technology are designed in appreciation of, certain modern packaging techniques (e.g., flip-chip packaging) can greatly reduce parasitics arising from de-coupling the memristors into a separate chip—making the heterogenous ASIC-memristor integrations of the present technology more appealing. Moreover, the present technology can purpose design the metal stack of the memristor interposer to reduce RC parasitics—without negatively impacting metal stack design optimizations for the ASIC chip. Such potential reductions in parasitics are illustrated in FIGS. 4 and 5.

For example, FIGS. 4 and 5 show a simulation comparison during a memristor read operation with and without package parasitics. That is, FIGS. 4 and 5 illustrate modeled parasitics between a memristor interposer and ASIC chip of the present technology where a memristor array resides on the memristor interposer while read circuits reside on the ASIC chip. As can be seen in FIGS. 4 and 5, the modeled parasitics are minimal in such a configuration.

In the example experiment/simulation, a 20-fF capacitance and 2-$\Omega$ resistance were assumed as parasitics from a bump for flip-chip packaging and a 50-$\Omega$ resistance from RDLs was added. Graph 400 of FIG. 4 shows a DC simulation (x-axis: memristor conductance, y-axis: output voltage) with different gain settings to cover a wide memristor conductance range. As can be seen, the output voltage is slightly decreased with gain 1 due to package and RDL parasitics. However, in many memristor array implementations such an effect is negligible because constituent memristors are rarely programed above 0.001 S. Graph 500 of FIG. 5 shows a time-domain simulation with gain 1 and memristor conductance of 1 mS. Due to package parasitics, the output voltage is reduced slightly by 2%, which may be acceptable in most applications. Relatedly, implementations can calibrate out most, if not all, of the error associated with package parasitics.

As used herein, the term "operative connection" (and its variants "operatively connected," "operatively connecting," etc.) may refer to a direct or indirect connection (e.g., a direct or indirect mechanical and/or electrical connection) between two components that allows the components to operate together. For example, an ASIC chip contact pad may be operatively connected to a memristor interposer contact pad. A solder ball may provide the operative connection between the ASIC chip contact pad and memristor interposer contact pad such that the ASIC chip contact pad and memristor interposer contact pad are mechanically/ electrically connected via the solder ball—thereby enabling the ASIC chip contact pad and memristor interposer contact pad to operate together by e.g., exchanging signals.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A memristor interposer comprising:
   a first plurality of memristor interposer contact pads located at an application specific integrated circuit (ASIC) chip-facing surface of the memristor interposer, the first plurality of memristor interposer contact pads being operatively connected to a plurality of ASIC chip contact pads located at a memristor interposer-facing surface of an ASIC chip;
   a memristor array operatively connected to at least one of the memristor interposer contact pads of the first plurality of memristor interposer contact pads; and
   a second plurality of memristor interposer contact pads located at a computing system-facing surface of the memristor interposer, the second plurality of memristor interposer contact pads operatively connected to a plurality of computing system contact pads.

2. The memristor interposer of claim 1, wherein a through silicon via (TSV) operatively connects a memristor interposer contact pad of the second plurality of memristor interposer contact pads to a memristor interposer contact pad of the first plurality of memristor interposer contact pads.

3. The memristor interposer of claim 2, wherein the TSV comprises:
   a first TSV segment operatively connecting the memristor interposer contact pad of the second plurality of memristor interposer contact pads to a first contact point of a redistribution layer (RDL);
   the RDL; and
   a second TSV segment operatively connecting a second contact point of the RDL with the memristor interposer contact pad of the first plurality of memristor interposer contact pads.

4. The memristor interposer of claim 1, further comprising programming circuitry for programming memristors of the memristor array.

5. The memristor interposer of claim 4, wherein the programming circuitry comprises one or more transistors operating at or above 1.5 volts.

6. The memristor interposer of claim 1, further comprising:
   a back end of line (BEOL) layer;
   a front end of line (FEOL) layer positioned between the BEOL layer and the computing system-facing surface of the memristor interposer; and
   a substrate positioned between the FEOL layer and the computing system-facing surface of the memristor interposer.

7. The memristor interposer of claim 6, wherein the memristor array is positioned between the FEOL layer and the ASIC chip-facing surface of the memristor interposer.

8. A memristor interposer comprising:
   a first plurality of memristor interposer contact pads located at an ASIC chip-facing surface of the memristor interposer, the first plurality of memristor interposer contact pads being operatively connected to a plurality of ASIC chip contact pads located at a memristor interposer-facing surface of an ASIC chip;
   a memristor array operatively connected to at least one of the memristor interposer contact pads of the first plurality of memristor interposer contact pads; and
   a second plurality of memristor interposer contact pads located at a computing system-facing surface of the memristor interposer, the second plurality of memristor interposer contact pads operatively connected to a plurality of computing system contact pads;
   wherein a TSV operatively connects a memristor interposer contact pad of the second plurality of memristor interposer contact pads to a memristor interposer contact pad of the first plurality of memristor interposer contact pads.

9. The memristor interposer of claim 8, further comprising:
   a first plurality of solder bumps operatively connecting the plurality of ASIC chip contact pads to the first plurality of memristor interposer contact pads; and
   a second plurality of solder bumps operatively connecting the second plurality of memristor interposer contact pads to the plurality of computing system contact pads.

10. The memristor interposer of claim 8, wherein the TSV comprises:
   a first TSV segment operatively connecting the memristor interposer contact pad of the second plurality of memristor interposer contact pads to a first contact point of a RDL;
   the RDL; and
   a second TSV segment operatively connecting a second contact point of the RDL with the memristor interposer contact pad of the first plurality of memristor interposer contact pads.

11. The memristor interposer of claim 8, wherein the memristor interposer comprises programming circuitry for programming memristors of the memristor array.

12. The memristor interposer of claim 8, wherein the programming circuitry for programming memristors of the memristor array comprises transistors operating at or above 2 volts.

13. The memristor interposer of claim 8, wherein the memristor interposer further comprises:
   a BEOL layer;
   a FEOL layer positioned between the BEOL layer and the computer system-facing surface of the memristor interposer; and
   a substrate positioned between the FEOL layer and the computer system-facing surface of the memristor interposer.

14. The memristor interposer of claim 13, wherein the memristor array is positioned between the FEOL layer and the ASIC chip-facing surface of the memristor interposer.

15. The memristor interposer of claim 14, wherein the BEOL layer of the memristor interposer comprises a fewer number of metal layers than a BEOL layer of the ASIC chip.

16. A device comprising:
   an ASIC chip comprising a plurality of ASIC chip contact pads located at a memristor interposer-facing surface of the ASIC chip; and
   a memristor interposer comprising:
      the first plurality of memristor interposer contact pads located at an ASIC chip-facing surface of the memristor interposer,
      a memristor array operatively connected to at least one memristor interposer contact pad of the first plurality of memristor interposer contact pads, and
      a second plurality of memristor interposer contact pads located at a computing system-facing surface of the memristor interposer.

17. The device of claim 16, further comprising:
   a first plurality of solder bumps operatively connecting the plurality of ASIC chip contact pads to the first plurality of memristor interposer contact pads; and
   a second plurality of solder bumps operatively connecting the second plurality of memristor interposer contact pads to the plurality of computing system contact pads.

18. The device of claim 17, wherein a TSV operatively connects a memristor interposer contact pad of the second plurality of memristor interposer contact pads to a memristor interposer contact pad of the first plurality of memristor interposer contact pads.

19. The device of claim 18, wherein the TSV comprises:
   a first TSV segment operatively connecting the memristor interposer contact pad of the second plurality of memristor interposer contact pads to a first contact point of a RDL;
   the RDL; and
   a second TSV segment operatively connecting a second contact point of the RDL with the memristor interposer contact pad of the first plurality of memristor interposer contact pads.

20. The device of claim 16, wherein the memristor interposer comprises programming circuitry for programming memristors of the memristor array.

* * * * *